(12) United States Patent
Yokoi et al.

(10) Patent No.: US 11,493,542 B2
(45) Date of Patent: Nov. 8, 2022

(54) SEMICONDUCTOR DEVICE

(71) Applicant: RENESAS ELECTRONICS CORPORATION, Tokyo (JP)

(72) Inventors: Yoshihiko Yokoi, Tokyo (JP); Yusuke Ojima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 212 days.

(21) Appl. No.: 17/036,952

(22) Filed: Sep. 29, 2020

(65) Prior Publication Data

US 2021/0141006 A1 May 13, 2021

(30) Foreign Application Priority Data

Nov. 8, 2019 (JP) .............................. JP2019-202963

(51) Int. Cl.
*G01R 19/10* (2006.01)
*H03K 17/687* (2006.01)

(52) U.S. Cl.
CPC ......... *G01R 19/10* (2013.01); *H03K 17/6871* (2013.01)

(58) Field of Classification Search
None
See application file for complete search history.

(56) References Cited

U.S. PATENT DOCUMENTS

| 5,621,601 | A | * | 4/1997 | Fujihira | ............. H03K 17/0828 |
| | | | | | 361/115 |
| 8,803,508 | B2 | * | 8/2014 | Nakatake | ................. H02H 3/08 |
| | | | | | 324/123 R |
| 2018/0033886 | A1 | * | 2/2018 | Mauder | ................. H01L 21/743 |
| 2019/0140630 | A1 | * | 5/2019 | Chen | .................... H01L 29/2003 |
| 2021/0141006 | A1 | * | 5/2021 | Yokoi | ................ H03K 17/6871 |

FOREIGN PATENT DOCUMENTS

| JP | 2001508279 A | * | 6/2001 | ................ H02P 1/00 |
| JP | 2019-120505 A | | 7/2019 | |

* cited by examiner

*Primary Examiner* — Thomas J. Hiltunen
*Assistant Examiner* — Khareem E Almo
(74) *Attorney, Agent, or Firm* — McDermott Will & Emery LLP

(57) ABSTRACT

A semiconductor device includes m power transistors (m is an integer of 2 or more) coupled in parallel each of which has a sense source terminal, a Kelvin terminal and a source terminal, a first average circuit that connects the first resistor and the second resistor in order between the sense source terminal and the Kelvin terminal and generates first to fourth average voltages and an arithmetic circuit that measures a first current value flowing through the sense source terminal from the first and second average voltages, measures a second current value flowing through the sense source terminal from the third and fourth average voltages and measures a current value flowing through the source terminal from the first to fourth average voltages and the first and second current values.

17 Claims, 18 Drawing Sheets

SEMICONDUCTOR DEVICE

CROSS-REFERENCE TO RELATED APPLICATIONS

The disclosure of Japanese Patent Application No. 2019- filed on Nov. 8, 2019 including the specification, drawings and abstract is incorporated herein by reference in its entirety.

BACKGROUND

The present invention relates to a semiconductor device, particularly an semiconductor device having a power transistor.

The Background of the Invention

In a battery pack incorporated in a power tool or a mobile device or the like, a power transistor for controlling the charging and discharging of the battery cell and a battery management IC for controlling the power transistor are mounted.

In the battery pack system, it is required that the current value flowing through the device can be monitored with high accuracy for the purpose of detecting the remaining battery level, controlling or monitoring the internal state, or system protection, etc. In addition, the same is required for semiconductor device for automobiles other than power tools and mobile devices.

Patent Document 1 discloses a technique for measuring the current flowing through a main power transistor using a sense transistor and a shunt resistor. More specifically, as shown in FIG. 3 of Patent Document 1, shunt resistors (Rs1, Rs2) having different resistance values are connected to the two sense transistors (31, 32), and the values of currents flowing through the shunt resistors are measured. Since the two sense transistors and the main power transistor 21 operate in a linear region, the current-voltage characteristics become linear. Therefore, as shown in FIG. 4 of Patent Document 1, the current-voltage characteristic is obtained from the measurement results by the two sense transistors and the current value flowing through the main power transistor can be measured from the current-voltage characteristic.

PRIOR-ART DOCUMENT

Patent Document

[Patent Document 1] Japanese Unexamined Patent Application Publication No. 2019-120505

SUMMARY

As shown in FIG. 1 of Patent Document 1, the power transistor 20 is a switch connected to a power path between the battery cell 10 and the load 90. However, since the power transistor has, in addition to the on-resistance of the power transistor itself, a resistance component such as a parasitic resistance caused by a package and a mounting state of the transistor, power loss occurs. To reduce this power loss, it is effective to connect a plurality of power transistors in parallel. If the power transistor is one, by the art described in Patent Document 1, it is possible to measure the current flowing through the power transistor with high accuracy. However, if a plurality of power transistors is coupled in parallel, highly accurate current measurement becomes difficult.

Further description will be made with reference to FIG. 18. In FIG. 18, power transistors 10, 20 each of which comprises a main power transistor and two sense transistors are connected in parallel on a power supply path. The shunt resistors Re, Rf are coupled to the power transistor 10. First, from the current-voltage characteristics obtained using the shunt resistors Re and Rf, the current value flowing through the power transistor 10 is obtained. Then, the total value of the current flowing through the power transistors 10 and 20, for example, is obtained by doubling the obtained current value. However, parasitic resistors Ra, Rb, Rc, Rd are present in the power transistors 10 and 20. Since it is difficult to match the characteristics (temperature characteristics) between the two power transistors considering the parasitic resistance, when the temperature changes, the shunting ratio of the current flowing through the power transistors 10 and 20 will change. Therefore, the accuracy of the obtained total value of the current is deteriorated.

Other objects and novel features will become apparent from the description of the specification and drawings.

A semiconductor device according to an embodiment includes m power transistors coupled in parallel (m is an integer of 2 or more) each of which has a sense source terminal, a Kelvin terminal and a source terminal, a first average circuit that couples a first resistor and a second resistor in order between the sense source terminal and the Kelvin terminal, and an arithmetic circuit, wherein the first average circuit that generates a first average voltage from the voltages of the m sense source terminals and a second average voltage from the voltages of the m Kelvin terminals when the first resistor is connected between the sense source terminal and the Kelvin terminal, generates a third average voltage from the voltages of the m sense source terminals and a fourth average voltage from the voltages of the m Kelvin terminals when the second resistor is connected between the sense source terminal and the Kelvin terminal, and wherein the arithmetic circuit that measures a first current value flowing through the sense source terminal from the first and second average voltages, measures a second current value flowing through the sense source terminal from the third and fourth average voltages, and measures a current value flowing through the source terminal from the first to fourth average voltages and the first and second current values.

In semiconductor device according to an embodiment, the current flowing through a plurality of power transistors coupled in parallel can be measured with high accuracy

DETAILED DESCRIPTION

Figure 1:
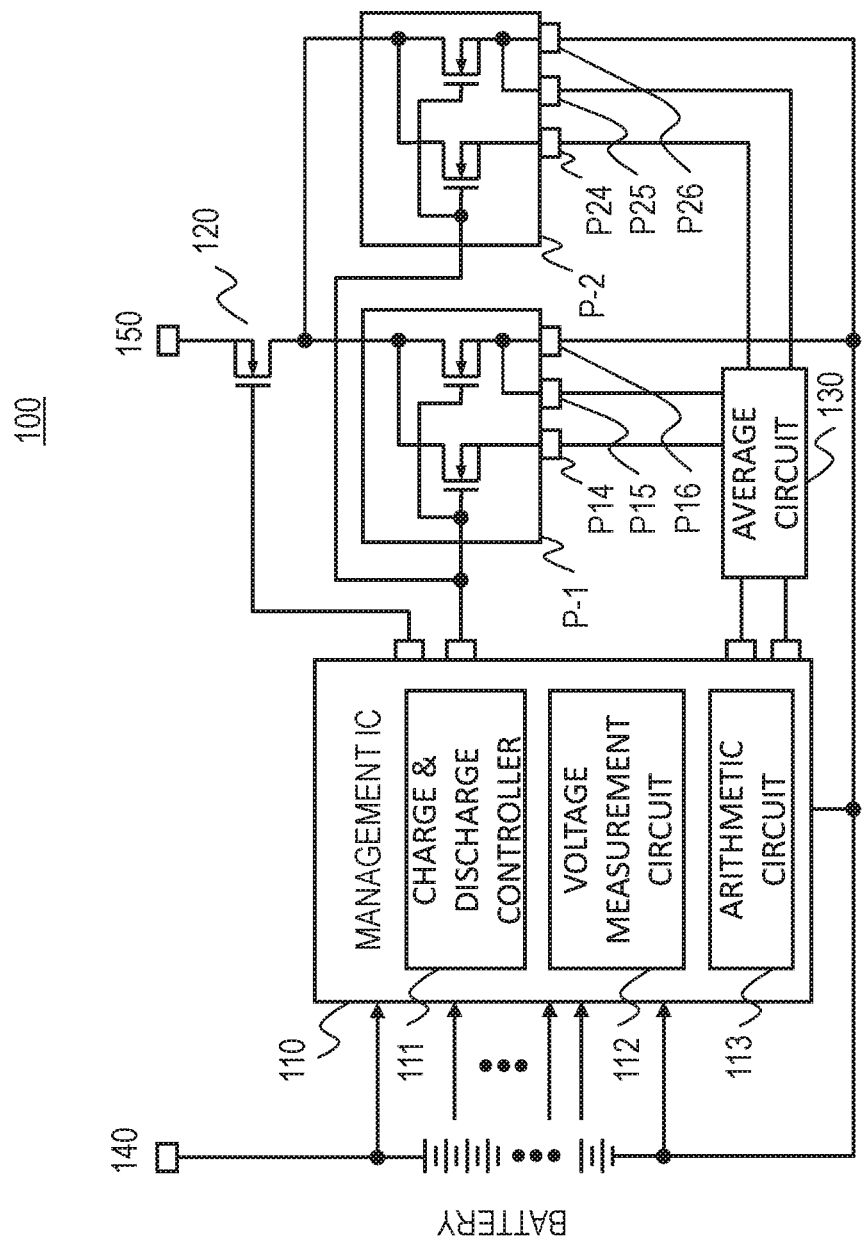
FIG. 1 is a schematic diagram of a semiconductor device according to a first embodiment.

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

FIG. 1 is a block diagram showing a configuration of a semiconductor device 100 according to a first embodiment.

As shown in FIG. 1, semiconductor device 100 is a semiconductor device that supplies a power to a load connected between terminals 140, 150 from a battery or charges the battery by a power from terminals 140, 150. Semiconductor device 100 has a management IC 110 (also referred to as the management circuit), power transistors 120, P-1, P-2, and average circuit 130. Power transistors P-1 and P-2 are coupled in parallel on the power supply path. P14 and P24 are sense source terminals, P15 and P25 are Kelvin terminals, and P16 and P26 are source terminals. Details of these terminals will be described later.

The management IC 110 includes a charge and discharge controller 111, a voltage measurement circuit 112, and an arithmetic circuit 113. Charge and discharge controller 111 is a circuit for controlling the power supply to the load and the charging to the battery, and generates a gate signal of the power transistors 120, P-1, P-2. Voltage measurement circuit. 112 is for measuring the voltage value of the output signal of the average circuit. 130 and includes A/D conversion circuit. (not shown). Arithmetic circuit 113, based on the voltage value measured by voltage measurement circuit 112, measures the current value flowing through the power transistors P-1 and P-2. Details of the voltage measurement circuit 112 and the arithmetic circuit 113 will be described later.

Average circuit 130 (first average circuit) is a circuit for averaging the output voltage of the power transistors P-1, P-2. Details of the average circuit 130 will be described later.

Figure 2:
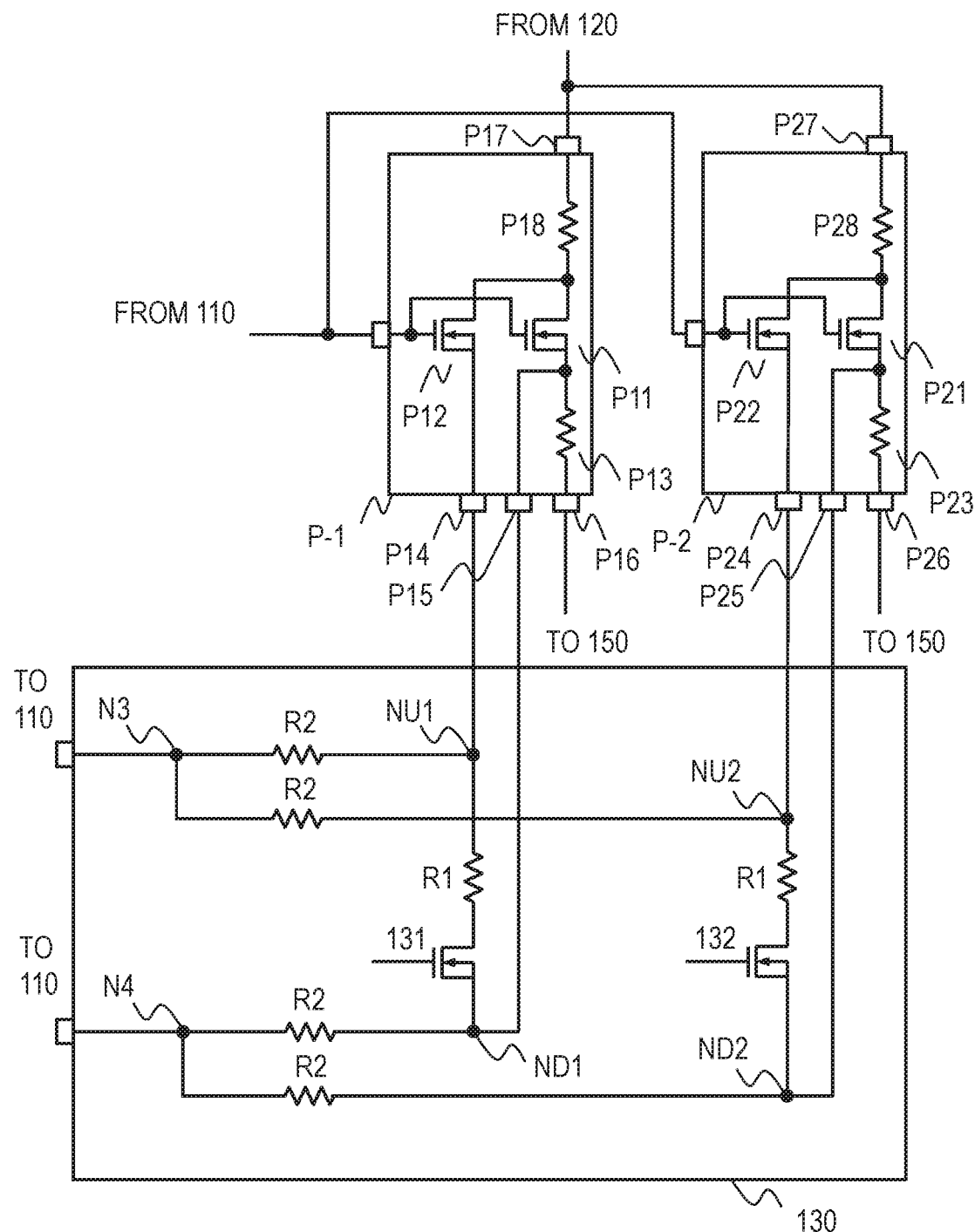
FIG. 2 is a block diagram of an average circuit according to the first embodiment.

Next, with reference to FIG. 2, the configuration of the power transistors P-1, P-2 and the average circuit 130 will be described. The power transistor P-1 includes an N-type power MOS transistor (hereinafter, also referred to as a main MOS transistor) P11, an N-type sense MOS transistor (hereinafter, also referred to as a sense MOS transistor) P12, and parasitic resistors P13 and P18. Sense MOS P12 is intended to divert a portion of the current flowing through the main MOS P11. Generally, the sense ratio of the main MOS P11 to the sense MOS P12 is n (n is any real number, typically on the order of 1000-10000):1. Here, the sense ratio is the ratio of the current flowing through the main MOS P11 and the current flowing through the sense MOS P12. The number of elements constituting the main MOS P11 and the number of elements constituting the sense MOS P12 affect the sense ratio.

The drain of the main MOS P11 and the drain of the sense MOS P12 are coupled to a drain terminal P17 via a parasitic resistor P18. The drain of the power transistor 120 is coupled to the drain terminal P17. The source of the sense MOS P12 is coupled to the sense source terminal P14. The source of the main MOS P11 is coupled to the Kelvin terminal P15 and to the source terminal P16 via the parasitic resistor P13. Here, the Kelvin terminal, as shown in FIG. 2, is a terminal to take out a signal from a position close to the source of the main MOS. The use of the Kelvin terminal makes it possible to eliminate the influence of the parasitic resistance.

Similarly, the power transistor P-2 includes a main MOS P21, a sense MOS P22, and parasitic resistors P23 and P28. The drain of the main MOS P21 and the drain of the sense MOS P22 are coupled to a drain terminal P27 via a parasitic resistor P28. The drain of the power transistor 120 is coupled to the drain terminal P27. The source of the sense MOS P22 is coupled to the sense source terminal P24. The source of the main MOS P21 is coupled to the Kelvin terminal P25 and to the source terminal P26 via the parasitic resistor P23.

Average circuit 130 has transistors 131, 132, a shunt resistor R1, and a resistor R2 The shunt resistor R1 is coupled between the node NU1 and the drain of transistor 131. The node NU1 is coupled to the sense source terminal P14. The shunt resistor R1 is coupled between the node NU2 and the drain of transistor 132. The node NU2 is coupled to the sense source terminal P24. The resistors R2 are coupled between the node NU1 and the node N3, and between the node NU2 and the node N3. The node N3 is coupled to the management IC 110. The source of the transistor 131 is coupled to the Kelvin terminal P15 via the node ND1. The source of the transistors 132 is coupled to the Kelvin terminal P25 via the nodes ND2. The resistors R2 are coupled between the node N4 and the node ND1, and between the node N4 and the node ND2. Node N4 is coupled to the management. IC 110. Note that the on-resistances of the transistors 131 and 132 are preferably set to be sufficiently smaller than the resistance value of the shunt resistor R1.

The average circuit 130 will be further described. The average circuit 130 is a circuit that generates an average voltage of voltages generated across the shunt resistors R1 when currents flow through the sense MOS P12 and P22. The voltages of the nodes NU1, NU2 and N3 are referred as VNU1, VNU2, VN3. VNU1 and VNU2 are divided by the resistor R2. $VN3=(VNU1+VNU2)/2$. The same applies to the node N4. The voltages of the nodes ND1, ND2 and N4 are referred as VND1, VND2, VN4. $VN4=(VND1+VND2)/2$.

Figure 3:
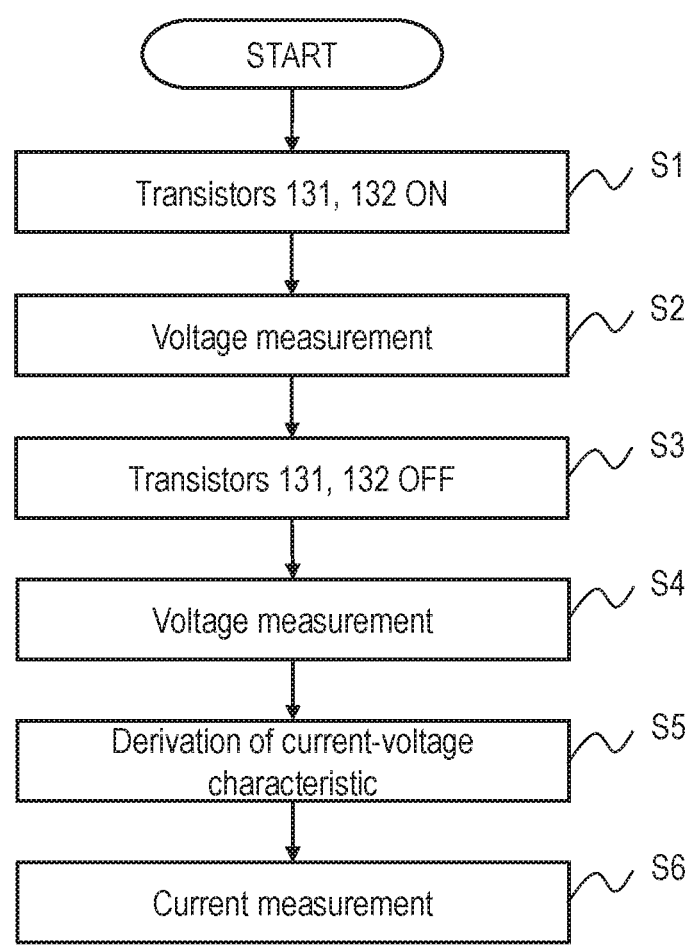
FIG. 3 is a flowchart for explaining the operation of semiconductor device according to the first embodiment.

Next, the operation of semiconductor device 100 according to the first embodiment will be described. FIG. 3 is a flowchart showing the operation of semiconductor device 100. Semiconductor device 100 starts operating under the control of the management IC 110. The management IC 110 generates gate signals for turning on the transistors 131 and 132 in order to calculate the currents flowing through the main MOS P11 and P21 (the currents flowing through the source terminals P16 and P26) during the operation of semiconductor device 100 (step S1). When the transistors 131 and 132 are turned on, a shunt resistor R1 as a first resistor is coupled between the sense source terminal P14 and the Kelvin terminal P15, and a shunt resistor R1 as a first resistor is coupled between the sense source terminal P24 and the Kelvin terminal P25, so that currents flow through the sense MOS P12 and P22. At this time, as described above, VN3 as the first average voltage and VN4 as the second average voltage: VN3=(VNU1+VNU2)/2, VN4=(VND1+VND2)/2. The management IC 110, by the voltage measurement circuit 112, converts the voltage values VN3, VN4 to digital values (step S2). The converted digital-values are referred as DVN3-1, DVN4-1. DVN3-1 and DVN4-1 are stored in a memory (not shown) of the management IC 110. Incidentally, the voltage measurement circuit 112 may convert the voltage difference between VN3-1 and VN4-1 to a digital value (ΔV1). This can be achieved by measuring VN3-1 with reference to VN4-1.

Next, the management IC 110 turns off the transistors 131 and 132 (step S3). The management IC 110 measures the voltage of the node N3 as the third average voltage and the voltage of the node N4 as the fourth average voltage. The management IC 110 converts the voltage values VN3, VN4 at this time to digital values (step S4). The converted digital-values are referred as DVN3-2, DVN4-2. The orders of step S1 and step S3 may be reversed. Similar to step S2, the management IC 110 may convert the voltage difference between VN3-2 and VN4-2 to a digital value (ΔV2).

Next, the managing IC 110 derives the current voltage characteristic of the sense MOS P12 (P22) from the obtained DVN3-1, DVN4-1, DVN3-2, DVN4-2. Description will be made with reference to FIG. 4. As described above, the main MOSP 11, P21, the sense MOS P12, P22 are operated in a linear region, the current-voltage characteristics become linear. First, the management IC 110 obtains the voltage difference ΔV1 between DVN3-1 and DVN4-1 by using the built-in arithmetic circuit 113. At this time, the current value of the current flowing through the sense MOS P12 (P22), i.e., the first current value, is referred as I1. I1 is obtained from ΔV1 and the resistance value of the shunt resistor R1. The determined ΔV1, I1 can be plotted as point P1 in FIG. 4.

Figure 4:
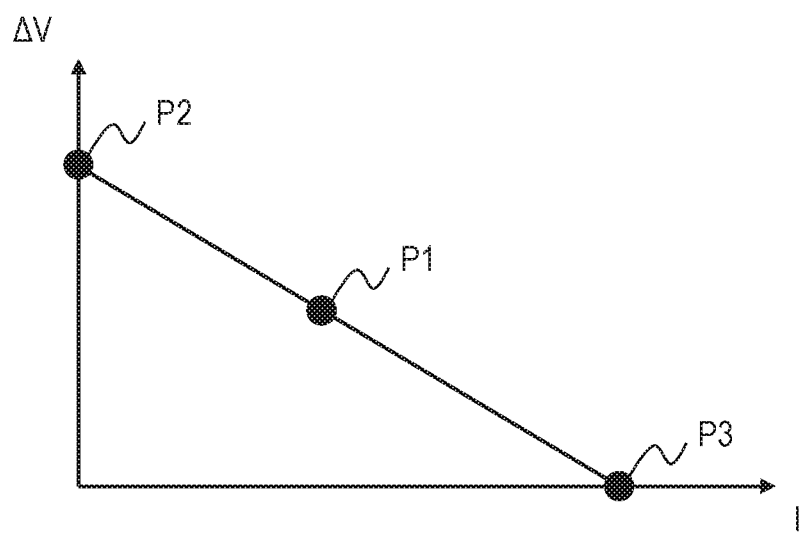
FIG. 4 is a graph for explaining current-voltage characteristics according to the first embodiment.

DVN3-2 and DVN4-2 will be similarly processed, but the meanings of DVN3-2 and DVN4-2 will be described here. DVN3-2 and DVN4-2 are the voltages obtained with transistors 131 and 132 turned off. At this time, the current value (second current value) of the current flowing through the sense MOS P12 (P22) is referred as I2. I2=0. In other words, no current flows through the sense MOS P12 and P22. In other words, this state is the same as the state in which the resistance value of the shunt resistor R1 is set to infinity. That is, resistor having an infinite resistance value as a second resistor is coupled between the sense source terminal P14 and the Kelvin terminal P15 and a resistor having an infinite resistance value as a second resistor is coupled between the sense source terminal P24 and the Kelvin terminal P25. Thus, the voltage difference ΔV2 between DVN3-2 and DVN4-2 can be plotted as point P2 in FIG. 4. Finally, as shown in FIG. 4, the current-voltage characteristic of the sense MOS P12 (P22) is obtained (step S5).

Next, the management IC 110 obtains the current value flowing through the main MOS P11 (P21) from the current-voltage characteristic of the sense MOS P12 (P22). The values of the currents flowing through the main MOS P11 and P21 can be converted from the values of the currents flowing through the sense MOS P12 and P22 when the resistance value of the shunt resistor R is 0, that is, when ΔV is 0. Therefore, the arithmetic circuit 113 calculates the current value of the point P3 of FIG. 4. By multiplying the calculated current value by the sense ratio, the current value flowing through the main MOS P11 (P21) is obtained (step S6). The obtained current value is approximately the average value of the current values flowing through the main MOS P11 and P21 even when the shunt ratio of the current flowing through the main MOSP11 and P21 changes with the temperature change.

As described above, in semiconductor device 100 according to the first embodiment, the average value of the current values flowing through the main MOS P11 and P21 can be measured by using the average circuit 130. Even if the characteristics of the parasitic resistances P13, P18, P23, and P28 and the on-resistances of the main MOS P11 and P21 are deviated, it is possible to suppress the effect of the temperature change on the measured values.

Incidentally, in first embodiment, an example in which two power transistors P-1 and P-2 are coupled in parallel has been described, but not limited thereto. The art is applicable to any number of power transistors in parallel.

Further, even if the number of parallel power transistors is any number, the number of measurements and the number of operations are not increased. Furthermore, as the parallel number of power transistors increases, there is a feature that the effect of suppressing the deterioration of the measurement accuracy is increased.

First Modified Example

Figure 5:
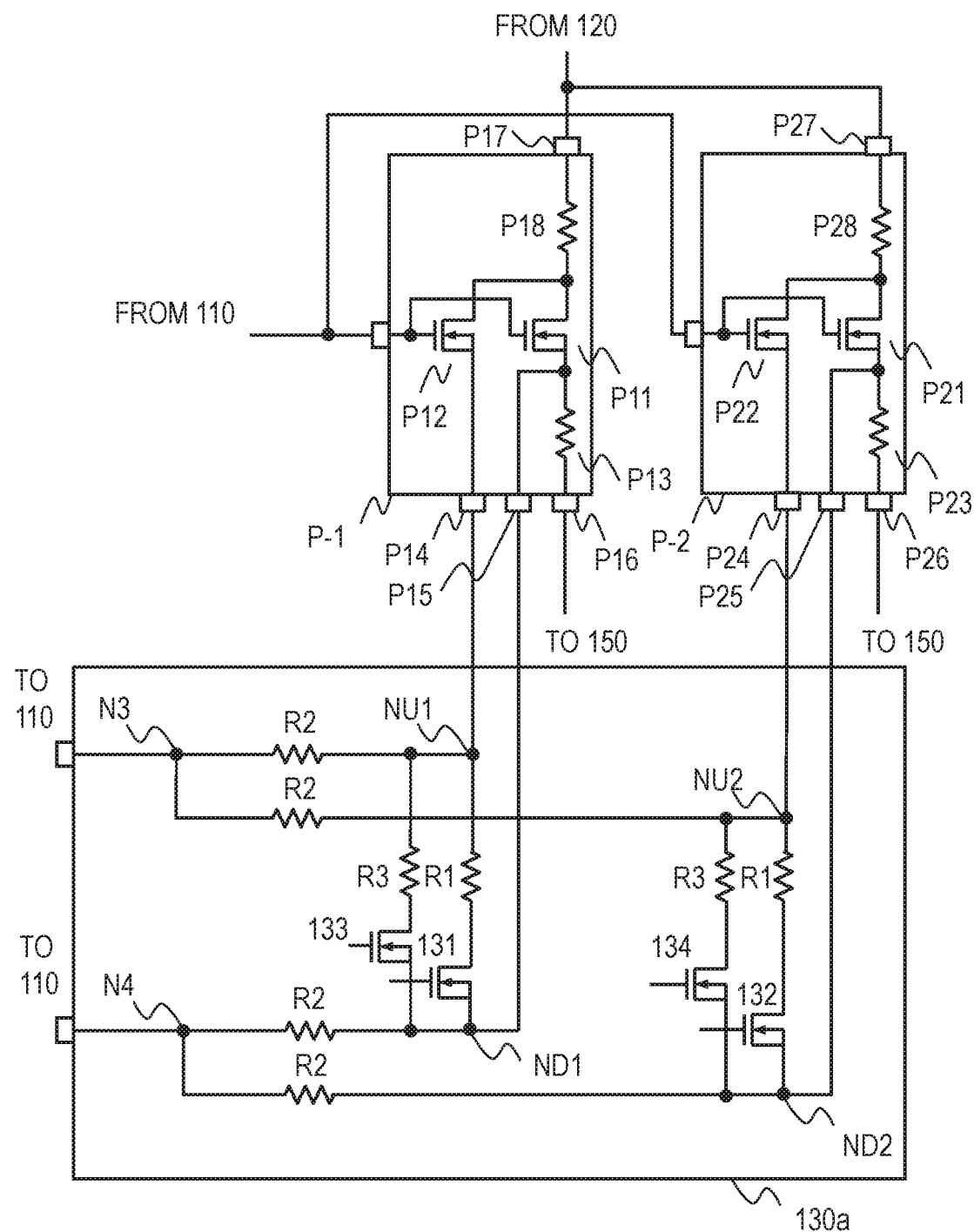
FIG. 5 is a diagram of first modified example of the first embodiment.

FIG. 5 is a circuit diagram of an average circuit 130a according to a first modified example.

The difference between the average circuit 130 and the average circuit 130a is that a shunt resistor R3 and a transistor 133 are added between the node NU1 and the node ND1, and a shunt resistor R3 and a transistor 134 are added between the node NU2 and the node ND2.

Figure 6:
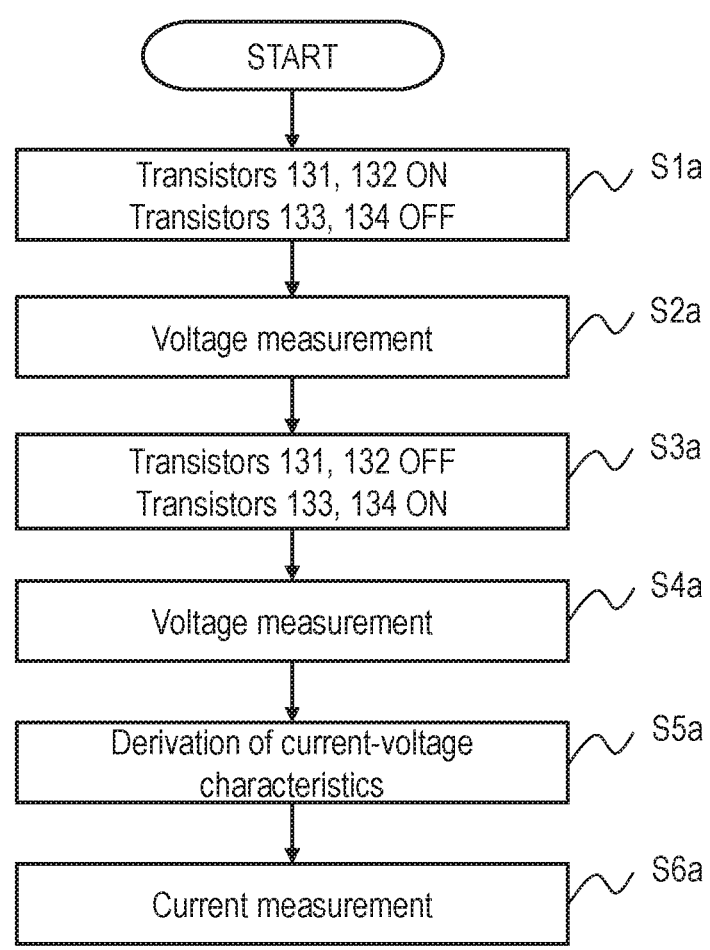
FIG. 6 is a flow chart for explaining the operation of the first modified example.

Next, the operation of the first modified example will be described. FIG. 6 is a flowchart for explaining the operation of the first modified example. When semiconductor device 100 starts operating, the management IC 110 generates gate signals for turning on the transistors 131, 132 as the first transistor, and turning off the transistors 133, 134 as the second transistor (step S1a). When the transistors 131 and 132 are turned on and the transistors 133 and 134 are turned off, the shunt resistor R1 as a first resistor is coupled between the sense source terminal P14 and the Kelvin terminal P15, the shunt resistor R1 as a first resistor is coupled between the sense source terminal P24 and the Kelvin terminal P25, and currents flow to the sense MOS P12 and P22. The circuit at this time is exactly the same circuit as step S1 of the first embodiment. Thus, the same DVN3-1, DVN4-1 as the first embodiment are obtained (step S2a).

Next, in step S3a, the management IC 110 generates gate signals for turning off the transistors 131 and 132 and turning on the transistors 133 and 134. When the transistors 131 and 132 are turned off and the transistors 133 and 134 are turned on, the shunt resistor R3 as a second resistor is coupled between the sense source terminal P14 and the Kelvin terminal P15, the shunt resistor R3 as a second resistor is coupled between the sense source terminal P24 and the Kelvin terminal P25, and currents flow to the sense MOS P12 and P22. The management IC 110 measures the voltage of the node N3 as a third average voltage and the voltage of the node N4 as a fourth average voltage. In step S4a, the management IC 110 converts the voltage values VN3, VN4 into digital values DVN3-2, DVN4-2. The obtained DVN3-2 depends on the shunt resistor R3.

Figure 7:
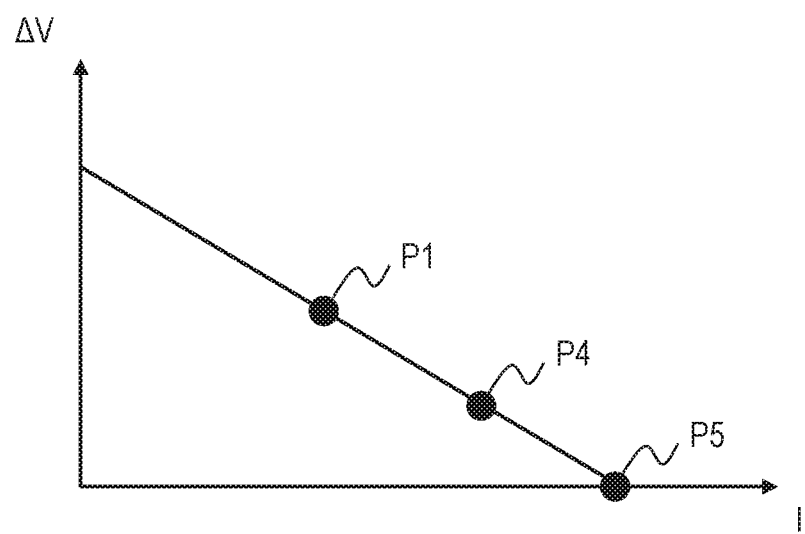
FIG. 7 is a graph for explaining current-voltage characteristics according to the first modified example.

Next, the management IC 110 derives a current-voltage characteristics of the sense MOS P12 and P22 from the obtained DVN3-1, DVN4-1, DVN3-2, DVN4-2. Details will be described with reference to FIG. 7. As described above, the obtained DVN3-1 and DVN4-1 are the same as DVN3-1 and DVN4-1 of the first embodiment. Thus, it can be plotted as point P1 in FIG. 7. Similarly, DVN3-2 and DVN4-2 can be plotted as points P4 in FIG. 7. If the resistance value of the shunt resistor R1 is larger than the resistance value of the shunt resistor R3, P4 will be plotted at the lower right of P1. Finally, the current-voltage characteristic of the sense MOS P12 (P22) as shown in FIG. 7 is obtained in step S5a.

Next, the management IC 110 obtains the current value flowing through the main MOS P11 (P21) from the current-voltage characteristic of the sense MOS P12 (P22). The current value flowing through the main MOS P11 (P21) can be converted from the current value flowing through the sense MOS P12 (P22) when the resistance value of the shunt resistors R1 and R3 is 0, that is, when $\Delta V$ is 0. Accordingly, the arithmetic circuit 113 calculates the current value at the point P5 in FIG. 7, and multiplies the calculated current value by the sense ratio to obtain the current value flowing through the main MOS P11 (P21) in step S6a. The obtained current value is approximately the average value of the current values flowing through the main MOS P11 and P21.

As described above, the first modified example can obtain the same effects as those of the first embodiment.

Second Modified Example

Figure 8:
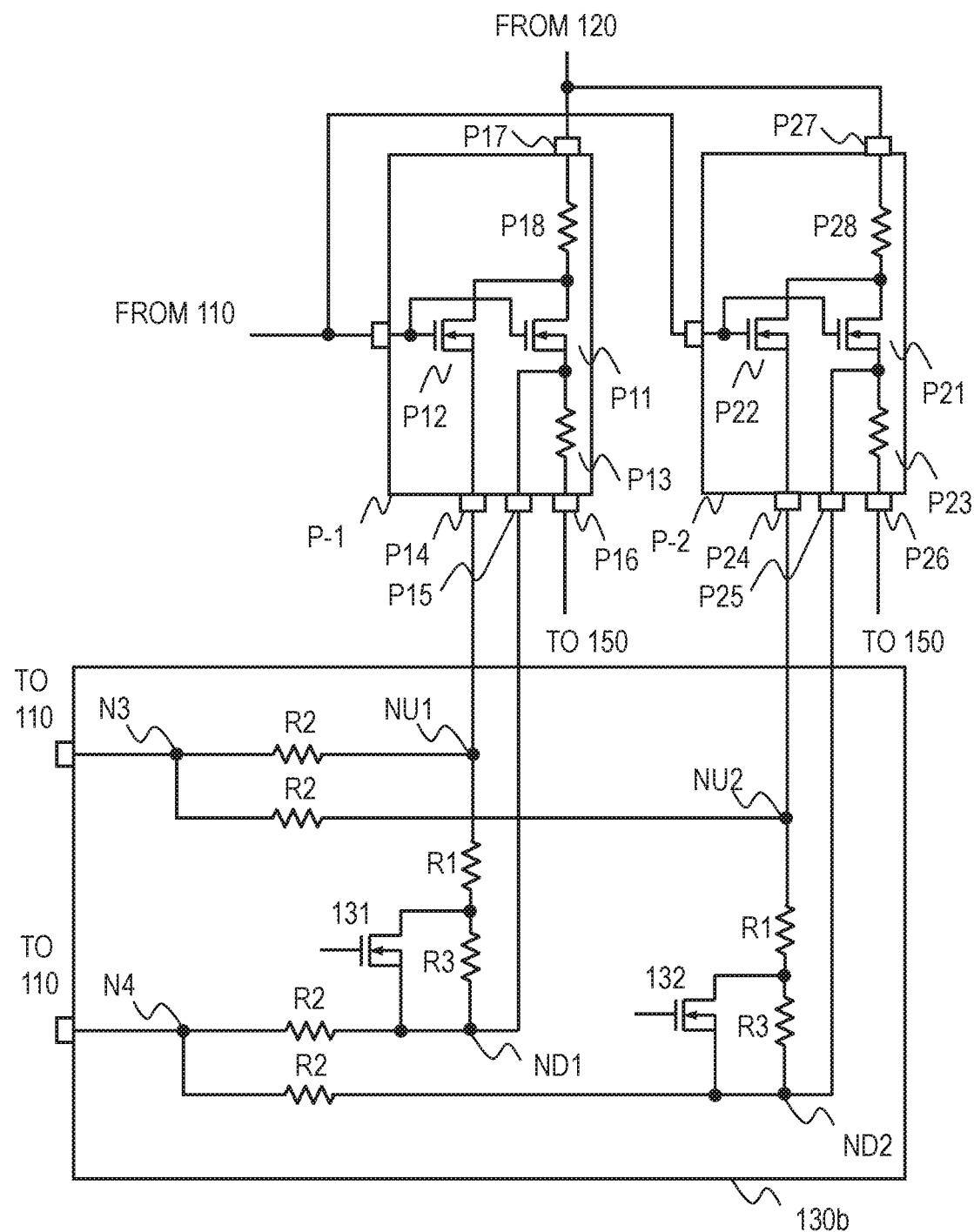
FIG. 8 is a diagram of u second modified example of the first embodiment.

FIG. 8 is a circuit diagram of an average circuit 130b according to a second modified example.

The difference from the average circuit 130a is that, shunt resistor R1 (as the second resistor and the fourth resistor) and a shunt resistor R3 (as the third resistor) is coupled in series between the node NM and the node ND1, and a transistor 131 (as the third transistor) is coupled between a node ND1 and a node to which the shunt resistors R1 and R3 are coupled. Further, a shunt resistor R1 (as the second resistor and the fourth resistor) and a shunt resistor R3 (as the third resistor) is coupled in series between the node NU2 and the node ND2, and a transistor 132 (as the third transistor) is coupled between a node ND2 and a node to which the shunt resistors R1 and R3 are coupled.

Next, the operation of the second modified example will be described. The flowchart for explaining the operation is the same as FIG. 3. When semiconductor device 100 starts operating, the management IC 110 turns on the transistors 131, 132 (step S1). When the transistor 131 is turned on, a current flowing through the sense MOS P12 flows from the shunt resistor R1 as the first resistor (fourth resistor) to the transistor 131. The same applies to the current flowing through the sense MOS P22. Therefore, the same DVN3-1, DVN4-1 as first embodiment are obtained.

Next, the management IC 110 turns off the transistors 131 and 132 (step S3). When the transistors 131 and 132 are turned off, the shunt resistor R1 and the shunt resistor R3 (as the second resistor) are coupled between the sense source terminal P14 and the Kelvin terminal P15, the shunt resistor R1 and the shunt resistor R3 (as the second resistor) are coupled between the sense source terminal P24 and the Kelvin terminal P25, and a currents flow through the sense MOS P12 and P22. The management IC 110 measures the voltage of the node N3 as the third average voltage and the voltage of the node N4 as the fourth average voltage. In step S4, the management IC 110 converts the voltage values VN3, VN4 into a digital values DVN3-2, DVN4-2. The obtained DVN3-2 depends on the combined resistance of the shunt resistors R1 and R3.

Figure 9:
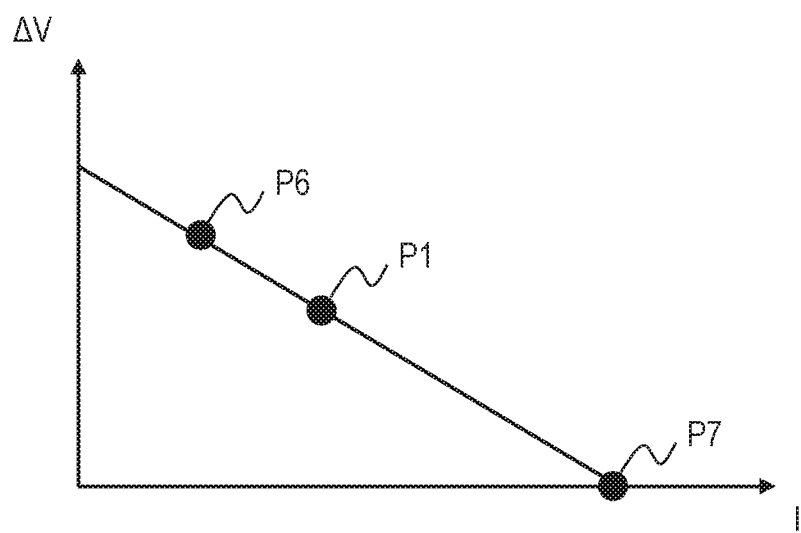
FIG. 9 is a graph for explaining current-voltage characteristics according to the second modified example.

Next, the management IC 110 derives the current-voltage characteristic of the sense MOS P12 (P22) from the obtained DVN3-1, DVN4-1, DVN3-2, DVN4-2. Details will be described with reference to FIG. 9. As described above, obtained DVN3-1 and DVN4-1 are the same as DVN3-1 and DVN4-1 of the first embodiment. Thus, it can be plotted as point P1 in FIG. 9. Similarly, DVN3-2 and DVN4-2 can be plotted as points PG in FIG. 9. Since the resistance value of the resistor in which the shunt resistor R1 and the shunt resistor R3 are cascaded is greater than the resistance value of the shunt resistor R1, PG is plotted at the upper left of P1. Finally, the current-voltage characteristic of the sense MOS P12 (P22) as shown in FIG. 9 is obtained (step S5).

Next, the managing IC110 obtains the current values flowing through the main MOSP11 P21 from the current-voltage characteristics of the sense MOSP12 P22. The current value flowing through the main MOS P11 (P21) can be converted from the current value flowing through the sense MOS P12 (P22) when the resistance values of the shunt resistors R1 and R3 are 0, that is, when $\Delta V$ is 0. Accordingly, the arithmetic circuit 113 calculates the current value at the point P7 in FIG. 9, and multiplies the calculated current value by the sense ratio to obtain the current value flowing through the main MOS P11 (P21) in step S6. The obtained current value is approximately the average value of the current values flowing through the main MOS P11 and P21.

As described above, the second modified example can obtain the same effects as the first embodiment and first modified example.

Second Embodiment

Figure 10:
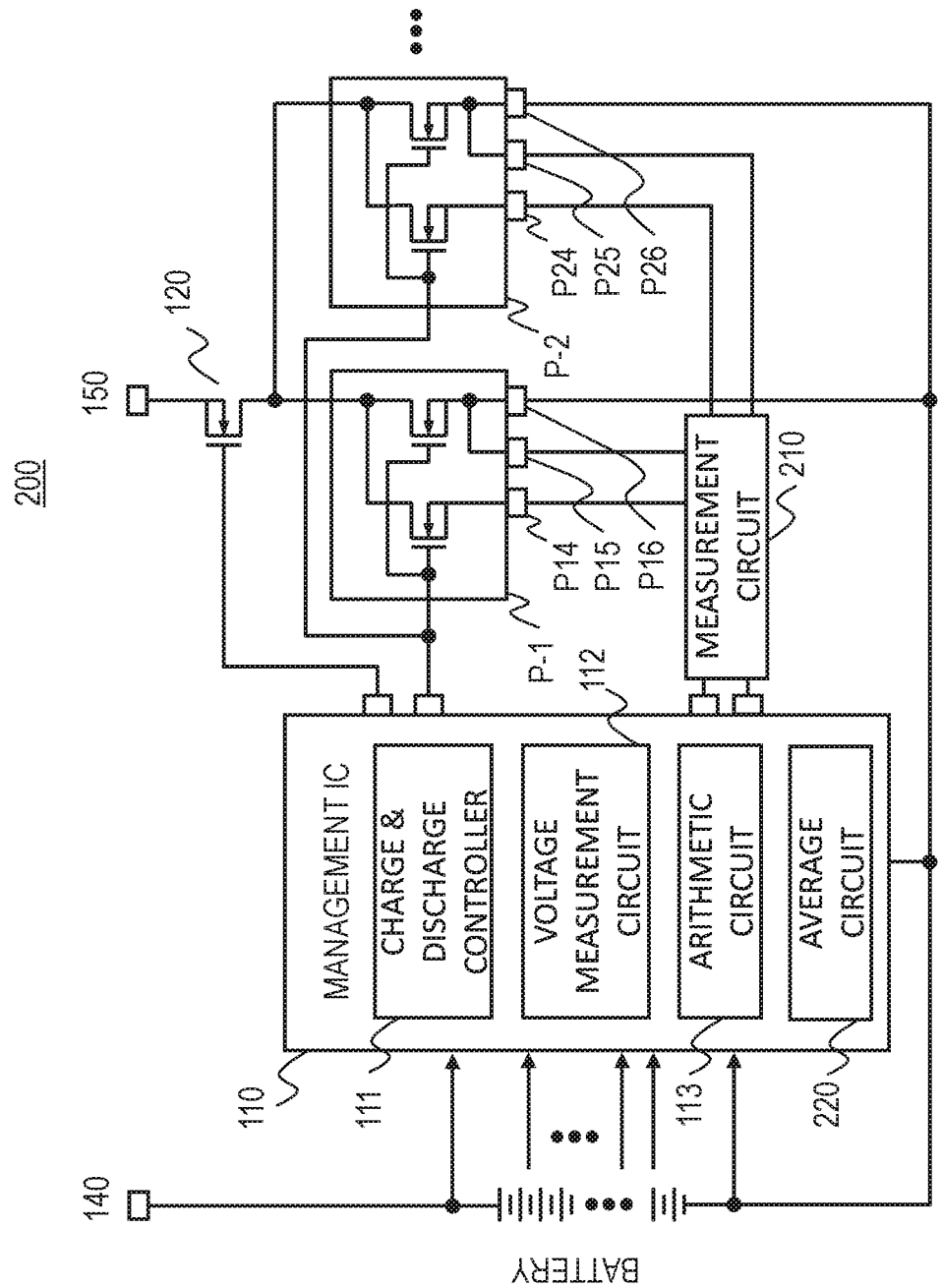
FIG. 10 is a diagram of a semiconductor device according to a second embodiment.

FIG. 10 is a block diagram showing a configuration of a semiconductor device 200 according to a second embodiment.

The difference from first embodiment is that the average circuit 130 replaces a measurement circuit 210. An average circuit 220 is also provided in the management IC 110.

Figure 11:
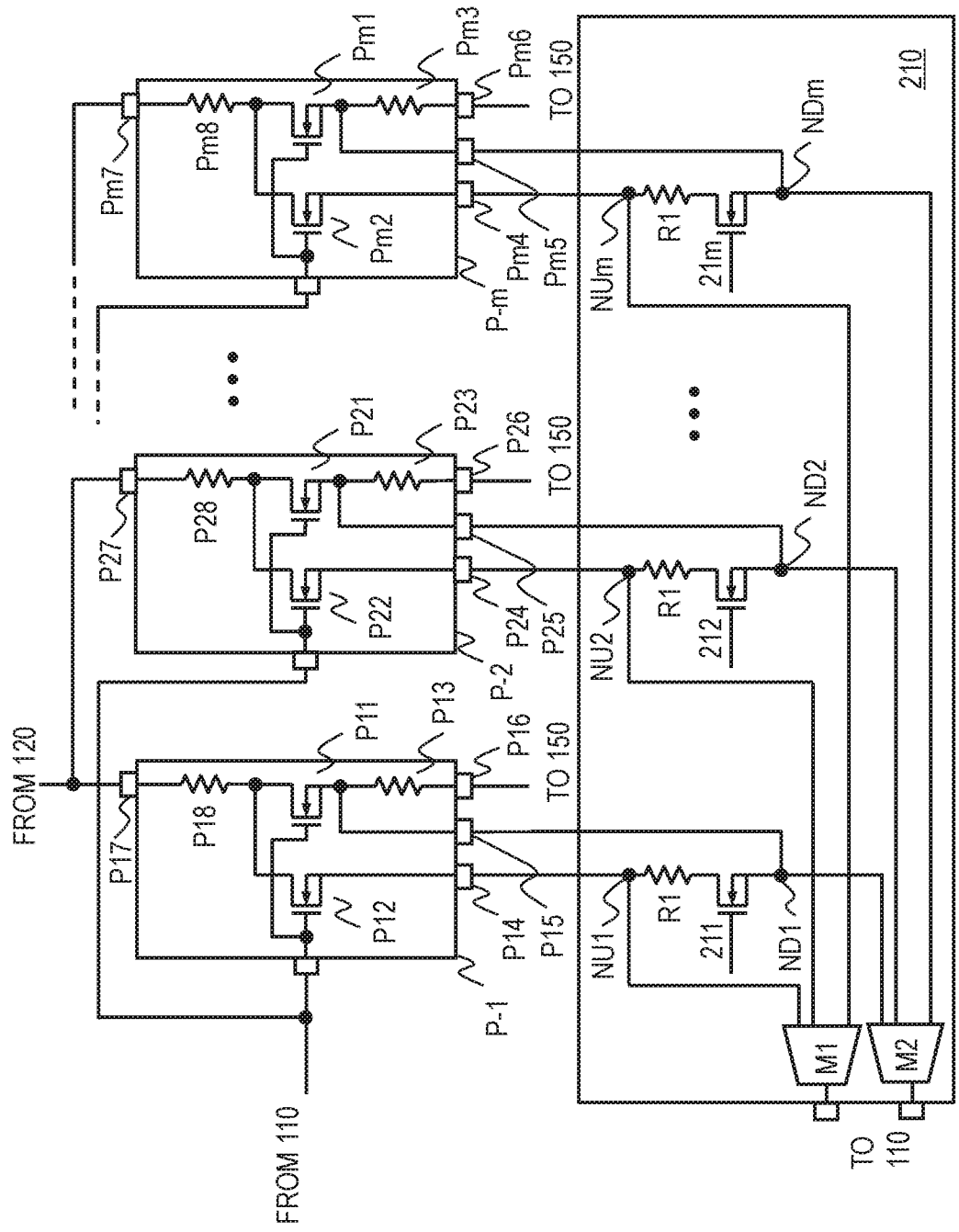
FIG. 11 is a block diagram of an average circuit according to the second embodiment.

Next, the configuration of the measurement circuit 210 will be described with reference to FIG. 11. FIG. 11 is a case where m power transistors (P-1, P-2, . . . , P-m) are coupled in parallel on the power supply path. The measurement circuit 210 has multiplexers (M1, M2) for sequentially selecting m power transistors (P-1, P-2, . . . , P-m). Here, the power transistor P-1 also referred to as a first power transistor, the power transistor P-2 also referred to as a second power transistor. More specifically, the multiplexer M1 selects one node from the nodes NU1, NU2, . . . , NUm in order, and connects the selected node to the management IC 110. The multiplexer M2 selects one node from the node ND1, ND2, . . . , NDm in order and connects the selected node to the management IC 110. The multiplexers M1 and M2 are selected by control signals (not shown) from the management IC 110.

Figure 12:
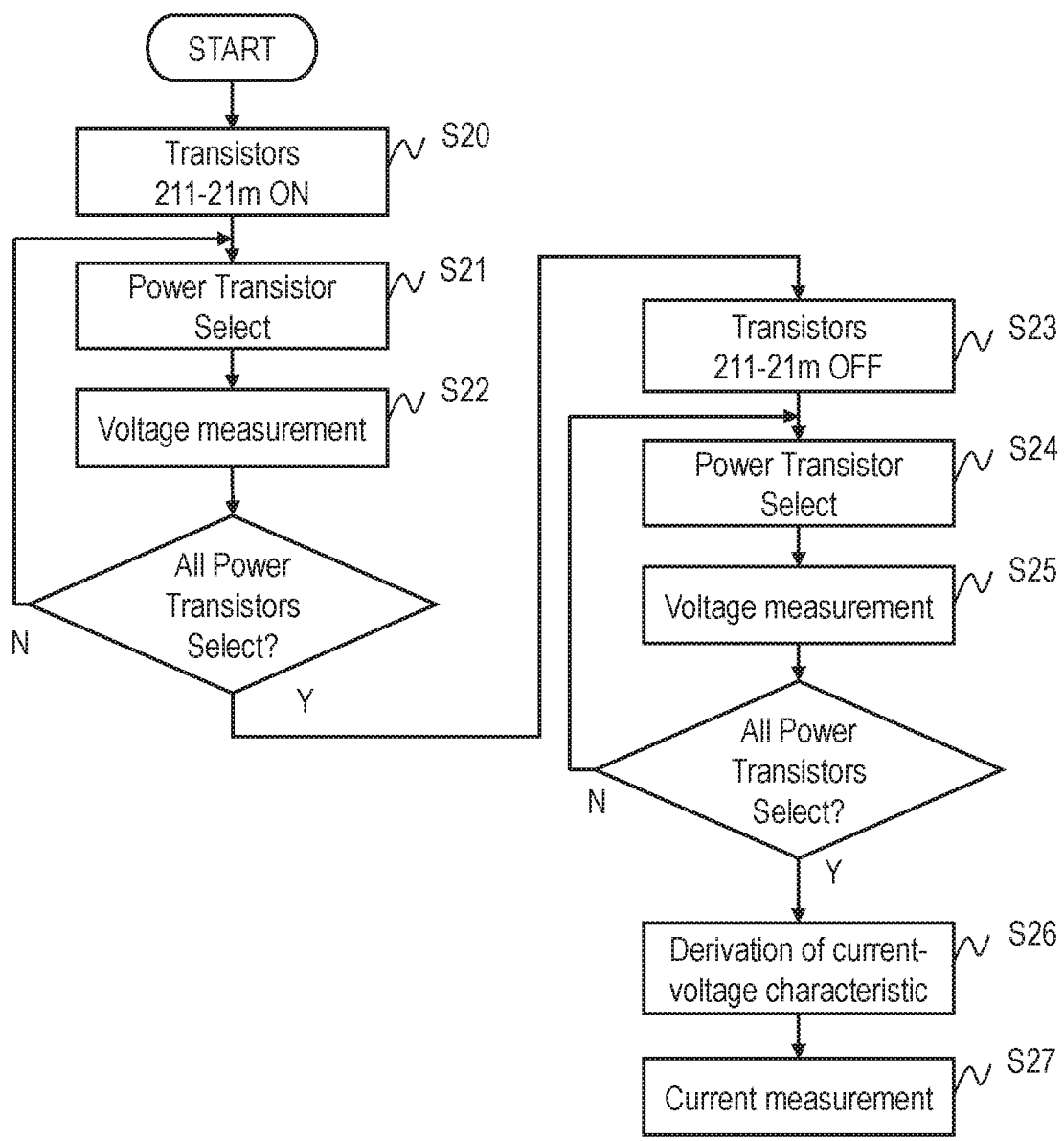
FIG. 12 is a flowchart for explaining the operation of semiconductor device according to the second embodiment.

Next, the operation of semiconductor device 200 according to the second embodiment will be described. FIG. 12 is a flowchart showing the operation of semiconductor device 200. When semiconductor device 200 starts to operate, the management IC 110 generates gate signals for turning on the transistors 211, 212, . . . , 21m in order to measure the currents flowing through the main MOS P11, P21, . . . , Pm1 during the operation of semiconductor device 200 in step S20.

Next, the management. IC 110 causes the multiplexers M1, M2 to select the power transistor P-1, i.e. the node NU1 and ND1 (step S21). The voltage measurement circuit 112 converts the voltage values of the node NU1 and ND1 to digital values (step S22). The arithmetic circuit 113 calculates the voltage difference between the node NU1 and ND1. Steps S21 and S22 are performed in order for all power transistors (P-1, P-2, . . . , P-m). As a result, m potential differences $\Delta V11$, $\Delta V21$, . . . , $\Delta Vm1$ are obtained. Here, $\Delta V11$ is also referred to as a first voltage difference, and $\Delta V21$ is also referred to as a second voltage difference. Incidentally, the voltage measurement circuit 112 may convert the voltage difference between the node NU1 and ND1 to a digital value ($\Delta V11$). This can be realized by measuring the voltage at the node NU1 with reference to the voltage at the node ND1. The same applies to the other nodes NU2, ND2, . . . , NUm, and NDm.

Next, the management IC 110 turns off the transistors 211, 212, . . . , 21m (step S23). The management IC 110 causes the multiplexers M1, M2 to select the power transistor P-1, i.e. the node NU1 and ND1 (step S24). The voltage measurement circuit 112 converts the voltage values of the node NU1 and ND1 to digital values (step S25). The arithmetic circuit 113 calculates the voltage difference between the node NU1 and ND1. Steps S24 and S25 are sequentially performed on all the power transistors P-1, P-2, . . . , P-m. As a result, m voltage differences $\Delta V12$, $\Delta V22$. $\Delta Vm2$ are obtained. Here, $\Delta V12$ is also referred to as a third voltage difference, and $\Delta V22$ is also referred to as a fourth voltage difference. Similar to step S22, the voltage measurement circuit 112 may convert the voltage difference between the node NU1 and ND1 to a digital value ($\Delta V12$). The same applies to the other nodes NU2, ND2, . . . , NUm, and NDm.

Next, in step S26, the arithmetic circuit 113 derives current-voltage characteristics of the respective sense MOS P12, P22, . . . , Pm2 based on the m voltage differences $\Delta Vm1$ and $\Delta Vm2$. The derivation of the current-voltage characteristic is the same as first embodiment, and thus description thereof will be omitted.

Next, in step S27, the arithmetic circuit 113 calculates the current values Is1, Is2, . . . , Ism flowing through the sense MOS P12, P22, . . . , Pm2 from the obtained current-voltage characteristics. Specifically, when the resistance value of the shunt resistor R1 is 0, i.e. when $\Delta V$ is 0, the current values flowing through the sense MOS P12, P22, . . . , Pm2 are calculated.

Finally, the average circuit 220 calculates the average value of Is1, Is2, . . . , Ism. Or, the average circuit 220 may calculate a current value flowing through the entire power transistors by multiplying Is1+Is2+ . . . +Ism by the overall sense ratio of all the transistors.

The second and third modified examples of first embodiment are also applicable to the second embodiment.

As described above, the semiconductor device 200 according to the second embodiment measures the current values flowing through the plurality of sense MOS individually, and measures the current flowing through the entire power transistor based on their average value. In this second embodiment, although the number of times of measurement and the size of the circuits are increased with respect to the first embodiment, the effect of suppressing the deterioration of the measurement accuracy is greater than the effect of first embodiment.

Third Modified Example

Figure 13:
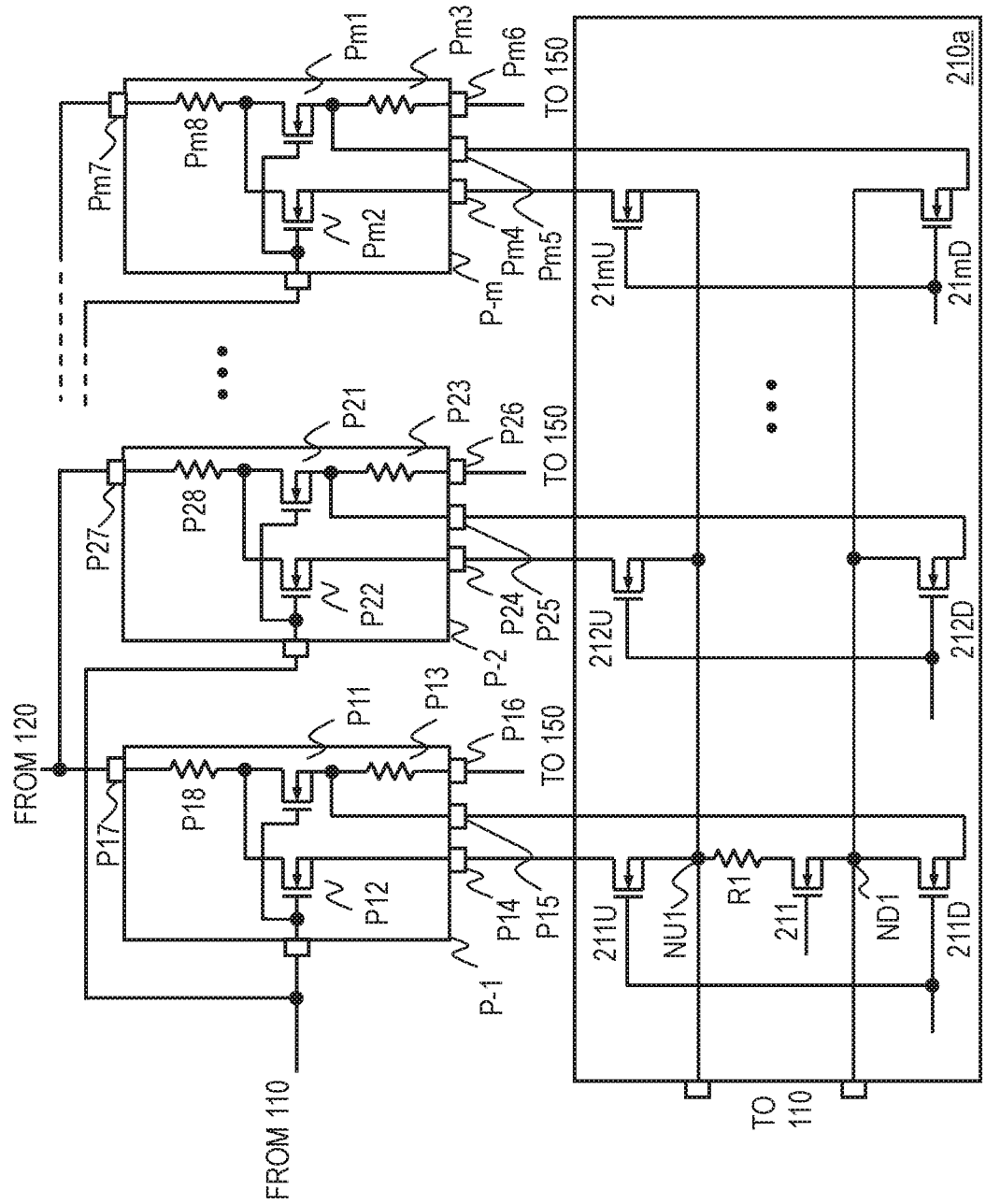
FIG. 13 is a diagram of third modified example of the second embodiment.

FIG. 13 is a block diagram showing a configuration of a measurement circuit 210a according to third modified example of second embodiment. The measurement circuit 210a replaces the measurement circuit 210 of FIG. 10.

The measurement circuit 210a includes one shunt resistor R1 and one transistor 211. In addition, it includes transistors 211U, 212U, . . . , 21mU, 211D, 212D, . . . , 21mD for sequentially selecting the power transistors P-1, P-2, . . . , P-m. The entire of the transistors 211U, 2122, . . . , 21mU, 211D, 212D, . . . , 21mD is also referred to as a selection circuit.

The control signals from the management IC 110 turn on any one of (211U, 211D), (212U, 212D), . . . , (21mU, 21mD), and the selected power transistor (P-1, . . . , P-m) is coupled to the shunt resistor R1 and the transistor 211. That is, in the second embodiment, the power transistors (P-1, . . . , P-m) are selected by the multiplexers M1 and M2, but in the third modified example, the power transistors (P-1, . . . , P-m) are selected by the transistors 211U, . . . , 21mU, 211D, . . . , 21mD.

The operation of the third modified example is the same as that of second embodiment, and therefore the explanation thereof is omitted.

As described above, since the shunt resistor is one in the third modified example, in addition to the effect of second embodiment, it is possible to reduce the circuit size. Further, by making the shunt resistor common, an effect of suppressing deterioration in measurement accuracy due to variation in the resistance value of the shunt resistor can also be expected.

Third Embodiment

Figure 14:
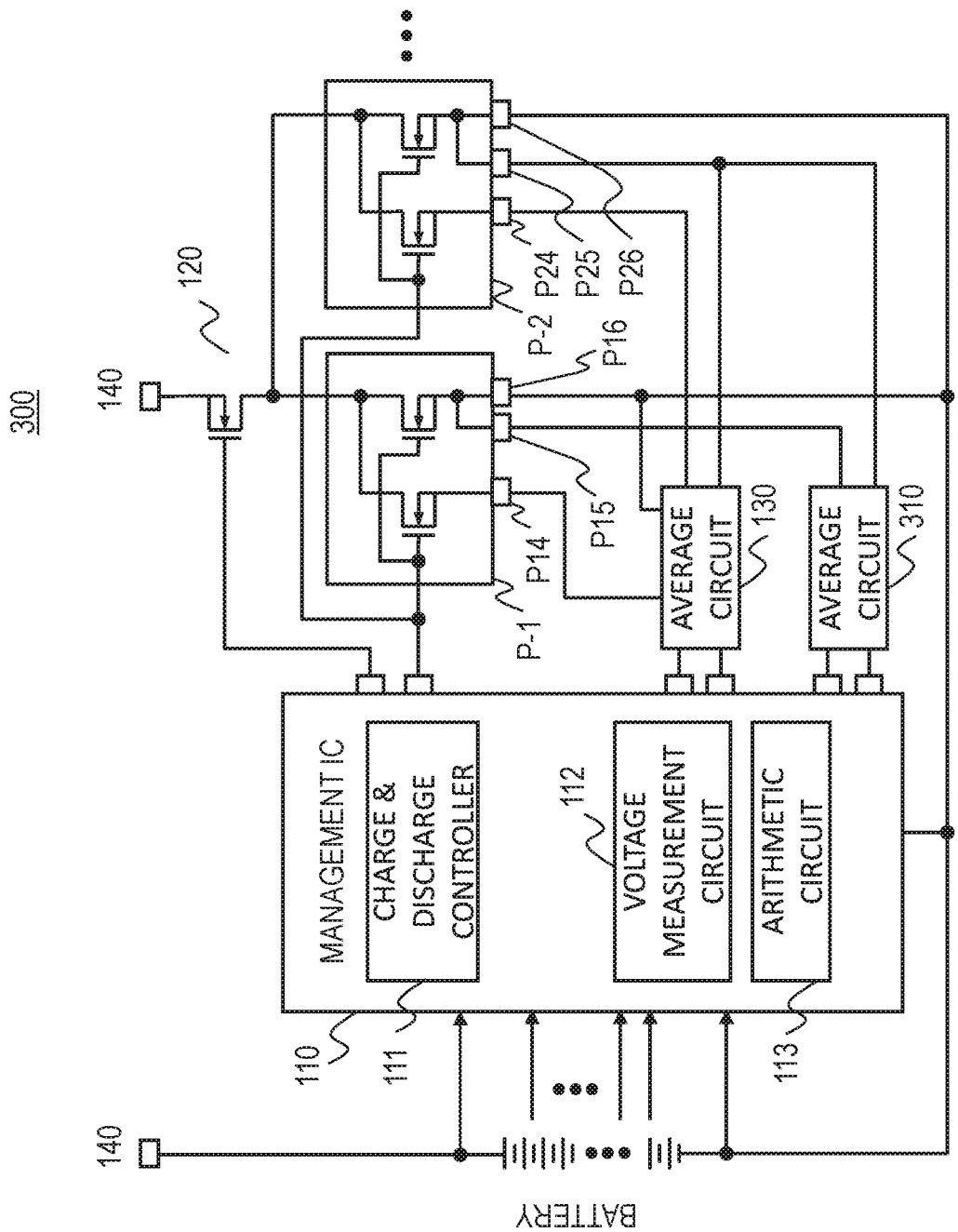
FIG. 14 is a diagram of a semiconductor device according to a third embodiment.

FIG. 14 is a block diagram showing a configuration of a semiconductor device 300 according to third embodiment.

The difference from the first embodiment is that an average circuit 310 (second average circuit) is added. The average circuit 310 is for detecting an overcurrent when an anomaly such as a short circuit of the power supply path occurs.

Figure 15:
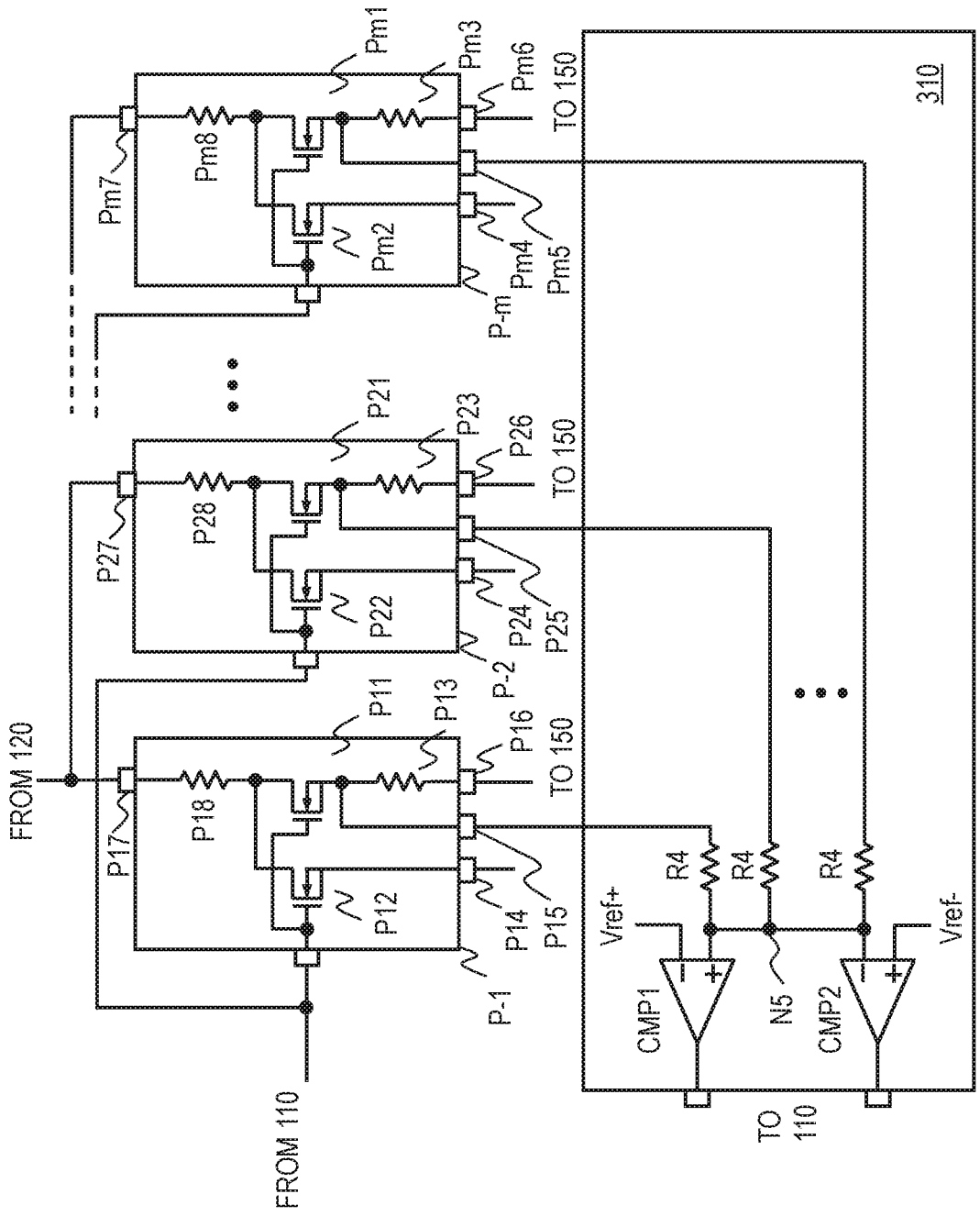
FIG. 15 is a block diagram of an average circuit according to the third embodiment.

Next, with reference to FIG. 15, the configuration of the average circuit 310. The average circuit 310 has a resistor R4 and comparators CMP1, CMP2. The Kelvin terminals (P15, P25, . . . , Pm5) of the respective power transistors (P-1, P-2, . . . , P-m) are coupled to the non-inverting terminal (+) of the comparator CMP1 and the inverting terminal (−) of the comparator CMP2 via the resistor R4. Reference voltage Vref+ as a first reference voltage is coupled to the inverting terminal of the comparator CMP1 as a first comparator. Reference voltage Vref− as a second reference voltage is coupled to the non-inverting terminal of the comparator CMP2 as a second comparator.

Next, the operation of semiconductor device 300 according to the third embodiment will be described. When semiconductor device 300 starts operating, current flows through the main MOS P11. At this time, a voltage corresponding to the parasitic resistance P13 and the current appears at the Kelvin terminal P15, and the source terminal P16 is the ground potential. The same applies to the main MOS P21, . . . , Pm1. The voltage of the node N5 is a voltage obtained by dividing the voltages of the respective Kelvin terminals (P15, P25, . . . , Pm5) by the resistor R4, that is, an average voltage (fifth average voltage) of the Kelvin terminals. Therefore, the voltage inputted to the non-inverting terminal of the comparator CMP1 and the inverting terminal of the comparator CMP2 is the average voltage of the voltages appearing at the Kelvin terminals P15, P25, . . . , Pm5.

The comparator CMP1 compares the average voltage of the Kelvin terminals with reference voltage Vref+. If the reference voltage Vref+, for example, is set to a voltage value corresponding to a value to be detected as an overcurrent in the discharge operation, the comparator CMP1 outputs a high-level signal when the discharge overcurrent flows in the power supply circuit. Similarly, if the reference voltage Vref−, for example, is set to a voltage value corresponding to a value to be detected as an overcurrent in the charging operation, the comparator CMP2 outputs a high-level signal when the charging overcurrent flows in the power supply circuit.

As described above, in semiconductor device 300 according to the third embodiment, it is possible to detect an overcurrent flowing through the power supply path. Further, since the A/D conversion is not used to detect the anomaly current, it is possible to quickly detect the abnormal current. Further, according to the third embodiment, an abnormal state such as a short-circuit failure of the main MOS P11, P21, . . . , and Pm1 can be detected, and an abnormal current can be detected even when the main MOS is in an off-state at the time of a charge operation.

Fourth Modified Example

Figure 16:
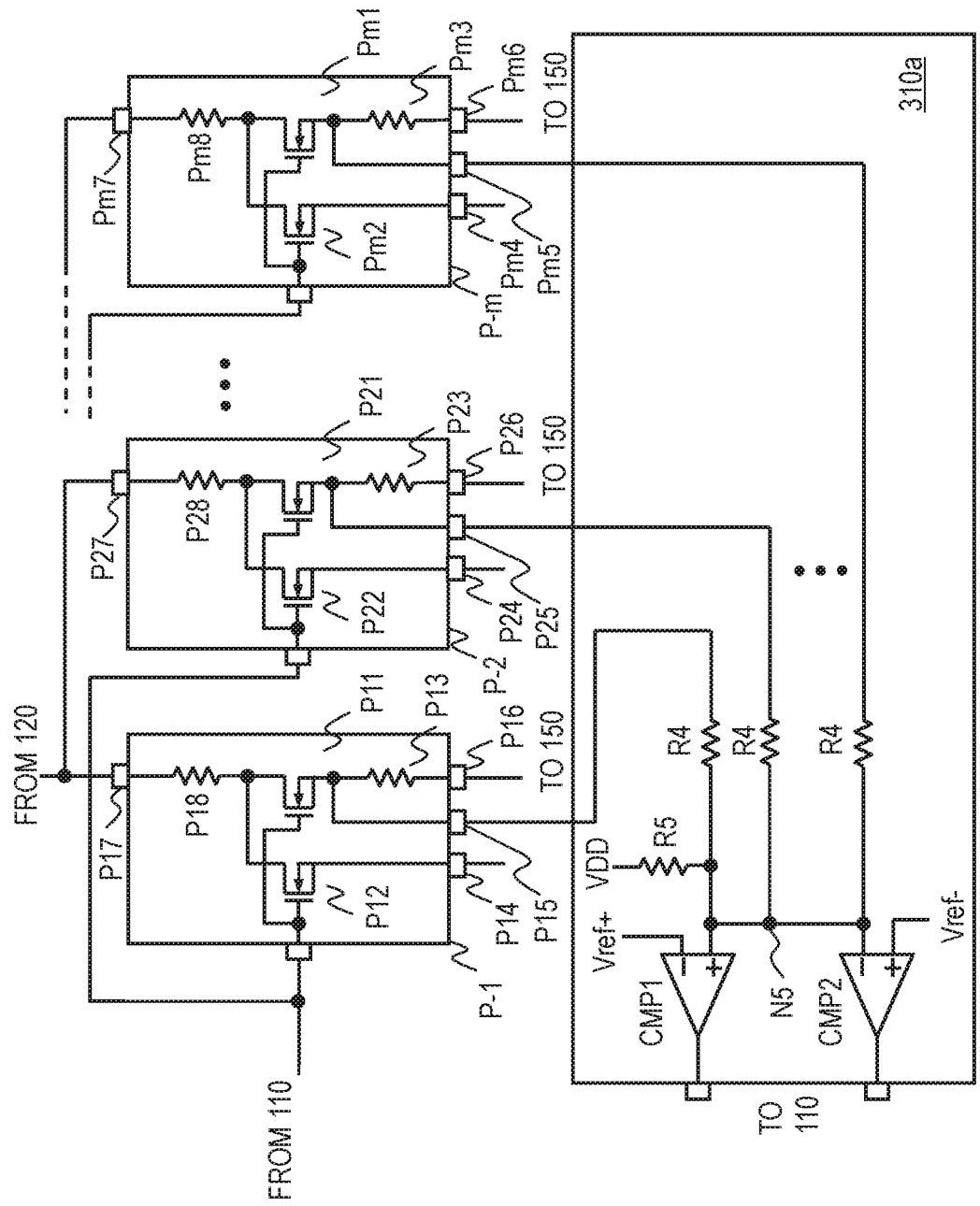
FIG. 16 is a diagram of a fourth modified example of the third embodiment.

FIG. 16 is a block diagram showing a configuration of an average circuit 310a according to fourth modified example of the third embodiment. The average circuit 310a replaces the average circuit 310 of FIG. 15. As shown in FIG. 16, in the average circuit 310a, a power supply voltage VDD is coupled to a node N5 via a resistor R5 as a fifth resistor.

Similarly to the third embodiment, voltages corresponding to the currents flowing through the main MOS P11, P21, . . . , and Pm1 appear at the respective Kelvin terminals P15, P25, . . . , and Pm5, and the average voltage of the voltages of the Kelvin terminals appears at the node N5 by the voltage division of the resistor R4. In this fourth modified example, since the resistor R5 is coupled between the node N5 and the power supply voltage VDD, the average voltage of Kelvin terminals is shifted to the power supply voltage side. This shift amount is determined by the ratio of the resistance values of the resistance R4 and the resistance R5. If reference voltage Vref+ and Vref−, respectively set to a voltage value corresponding to a value to be detected as an overcurrent in the discharging operation and a value to be detected as an overcurrent in the charging operation, the comparator CMP1 or the comparator CMP2 outputs a high-level signal when an overcurrent flows in the power supply circuit.

As described above, the fourth modified example can detect overcurrent during charge operation without using a negative power supply for reference voltage Vref− or comparator.

Fifth Modified Example

Figure 17:
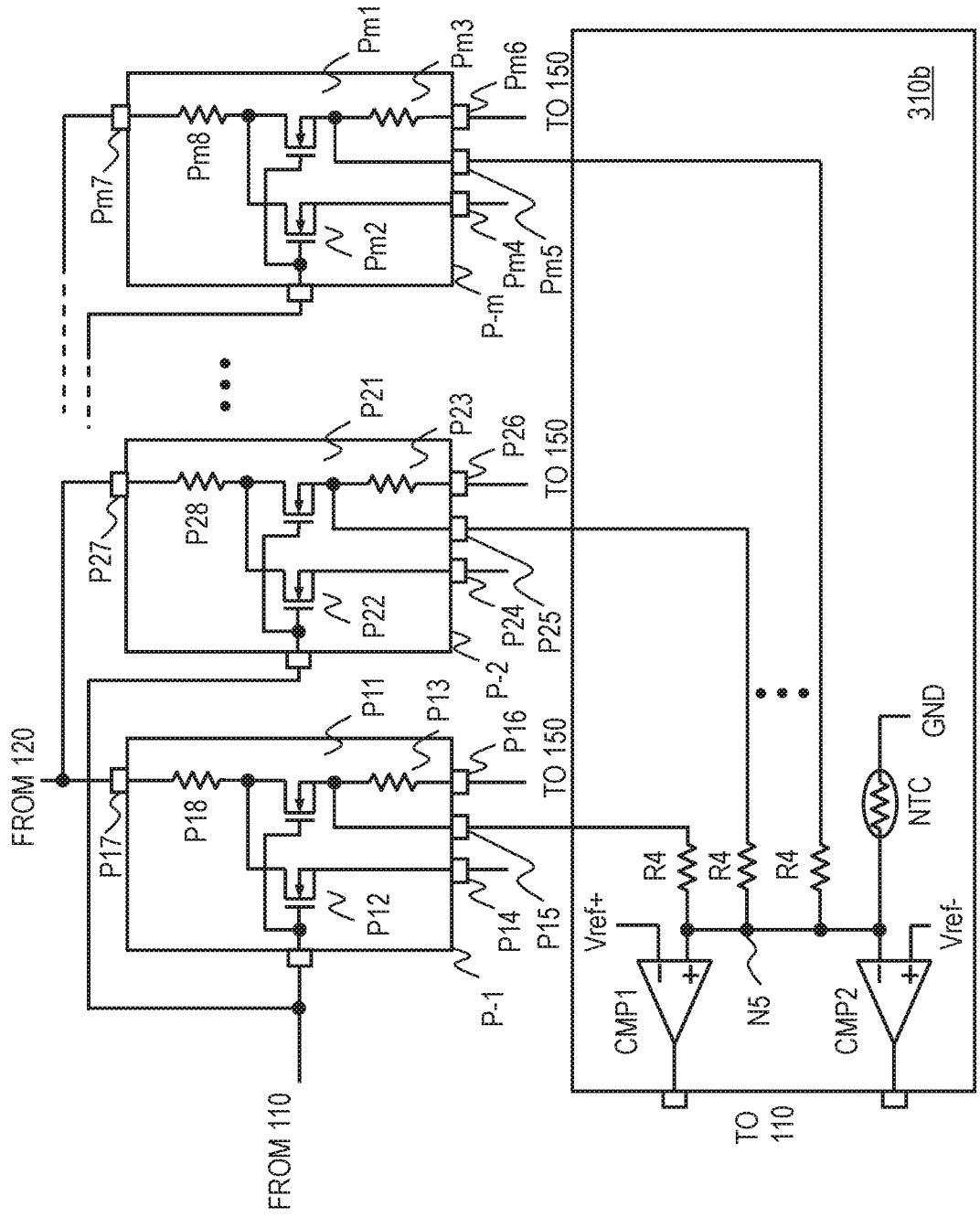
FIG. 17 is a diagram of a fifth modified example of the third embodiment.
Figure 18:
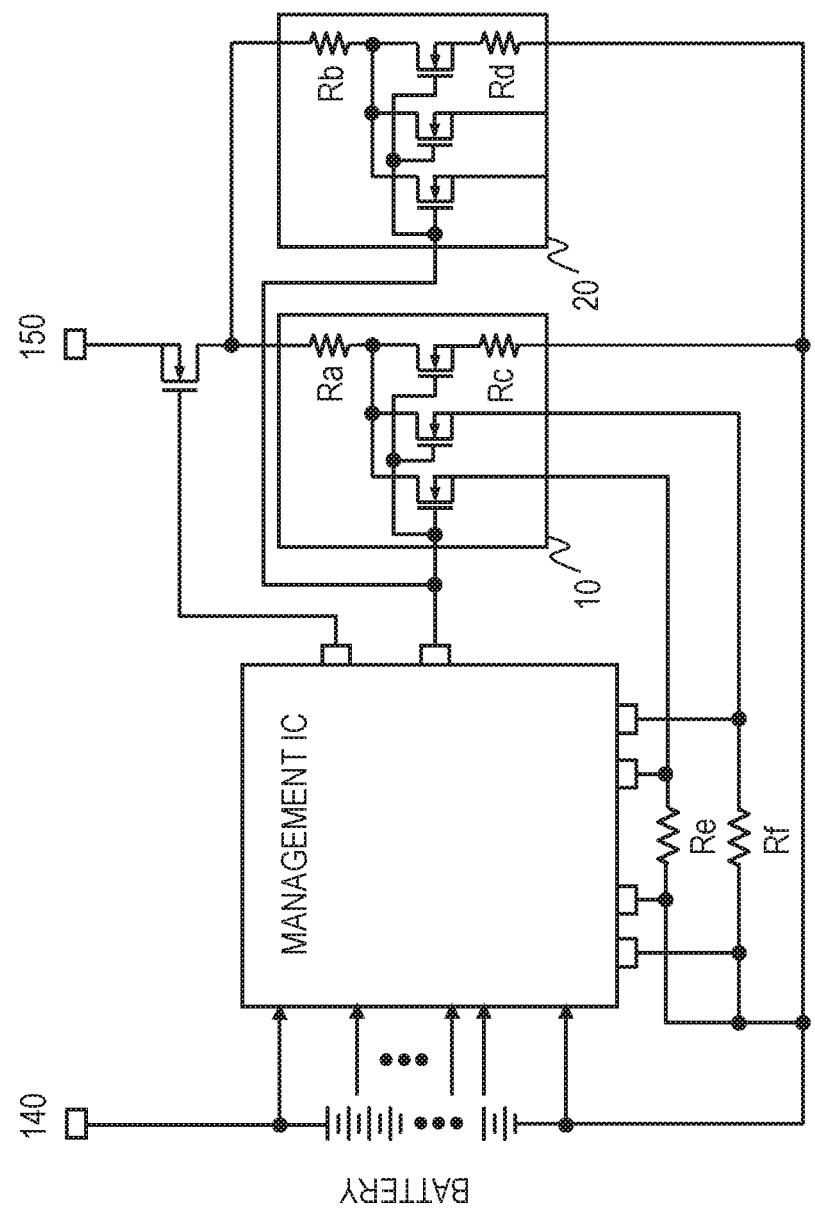
FIG. 18 is a block diagram of a conventional semiconductor device.

FIG. 17 is a block diagram showing a configuration of an average circuit 310b according to fifth modified example of the third embodiment. The average circuit 310b replaces the average circuit 310 of FIG. 15. As shown in FIG. 17, in the average circuit 310b, a ground (CND) is connected to a node N5 via an NTC (Negative Temperature Coefficient) thermistor.

In the third embodiment, an abnormal current is detected using the parasitic resistors P13, P23, . . . , Pm3. However, the parasitic resistance (=metal resistance) has a positive temperature characteristic, and when the temperature rises, for example, an overcurrent is detected at a lower current value than when the temperature is low. Therefore, in the fifth modified example, the NTC thermistor having a negative temperature characteristic, for example, shifts the voltage of the node N5 to the ground side when the temperature is increased, and the effect of the change in resistance value of the parasitic resistance due to the temperature change is suppressed. The operation is the same as that of third embodiment, and therefore the explanation thereof is omitted. The fifth modified example is also applicable to the fourth modified example.

As described above, in the fifth modified example, even if there is a temperature change, it is possible to quickly detect the abnormal current without reducing the accuracy.

It should be noted that the present invention is not limited to the above-mentioned embodiments, and various modifications can be made without departing from the gist thereof.

What is claimed is:

1. A semiconductor device comprising:
    m power transistors (m is an integer of 2 or more) coupled in parallel each of which has a sense source terminal, a Kelvin terminal and a source terminal;
    a first average circuit that connects a first resistor and a second resistor in order between the sense source terminal and the Kelvin terminal; and
    an arithmetic circuit,
    wherein the first average circuit:
        generates a first average voltage from the voltages of the in sense source terminals and a second average voltage from the voltages of the m Kelvin terminals when the first resistor is connected between the sense source terminal and the Kelvin terminal,
        generates a third average voltage from the voltages of the m sense source terminals and a fourth average voltage from the voltages of the m Kelvin terminals when the second resistor is connected between the sense source terminal and the Kelvin terminal, and
    wherein the arithmetic circuit:
        measures a first current value flowing through the sense source terminal from the first and second average voltages,
        measures a second current value flowing through the sense source terminal from the third and fourth average voltages, and
        measures a current value flowing through the source terminal from the first to fourth average voltages and the first and second current values.

2. The semiconductor device according to claim 1,
    wherein each of the m power transistors has a sense MOS transistor and a main MOS transistor,
    wherein a source of the sense MOS transistor is coupled to the sense source terminal, and
    wherein a source of the main MOS transistor is coupled to the Kelvin terminal.

3. The semiconductor device according to claim 2, wherein there is a parasitic resistance between the source of the main MOS transistor and the source terminal.

4. The semiconductor device according to claim 3, wherein the arithmetic circuit calculates a current-voltage characteristic of the sense MOS transistor from a difference between the first and second average voltages, a difference between the third and fourth average voltages and the first and second current values, and measures a current flowing through the main MOS transistor from the current-voltage characteristic.

5. The semiconductor device according to claim 4, wherein the second resistor is in a state of being unconnected between the sense source terminal and the Kelvin terminal.

6. The semiconductor device according to claim 4, further comprising:
a first transistor coupled in series with the first resistor; and
a second transistor coupled in series with the second resistor.

7. The semiconductor device according to claim 4,
wherein the second resistor comprises a third and fourth resistors connected in series,
wherein the first resistor comprises the fourth resistor, and
wherein a third transistor is coupled to a connection point of the third and fourth resistors.

8. The semiconductor device according to claim 3, further comprising:
a second average circuit that generates a fifth average voltage from the voltages of the m Kelvin terminals and detects an anomaly in currents flowing through the source terminals of the m power transistors from the fifth average voltage.

9. The semiconductor device according to claim 8, wherein the second average circuit has a first comparator that compares the fifth average voltage and a first reference voltage.

10. The semiconductor device according to claim 9,
wherein the second average circuit further comprises a second comparator,
wherein the fifth average voltage is inputted to a non-inverting input of the first comparator and an inverting input of the second comparator,
wherein the first reference voltage is coupled to an inverting input of the first comparator, and
wherein a second reference voltage is coupled to the non-inverting input of the second comparator.

11. The semiconductor device according to claim 10, wherein a power supply voltage is further coupled to the non-inverting input of the first comparator and the inverting input of the second comparator via a fifth resistor.

12. The semiconductor device according to claim 10, wherein a ground is further coupled to the non-inverting input of the first comparator and the inverting input of the second comparator via an NTC thermistor.

13. A semiconductor device comprising:
a first and second power transistors coupled in parallel each of which includes a sense source terminal, a Kelvin terminal and a source terminal;
first and second resistors; and
an arithmetic circuit,
wherein the arithmetic circuit:
measures a first potential difference between the sense source terminal and the Kelvin terminal, and a first current value flowing through the sense source terminal when the first resistor is coupled between the sense source terminal and the Kelvin terminal of the first power transistor,
measures a second potential difference between the sense source terminal and the Kelvin terminal, and a second current value flowing through the sense source terminal when the second resistor is coupled between the sense source terminal and the Kelvin terminal of the first power transistor,
measures a current value flowing through the source terminal of the first power transistor from the first and second potential differences and the first and second current values,
measures a third potential difference between the sense source terminal and the Kelvin terminal, and a third current value flowing through the sense source terminal when the first resistor is coupled between the sense source terminal and the Kelvin terminal of the second power transistor,
measures a fourth potential difference between the sense source terminal and the Kelvin terminal, and a fourth current value flowing through the sense source terminal when the second resistor is coupled between the sense source terminal and the Kelvin terminal of the second power transistor, and
measures a current value flowing through the source terminal of the second power transistor from the third and fourth potential differences and the third and fourth current values.

14. The semiconductor device according to claim 13,
wherein the first power transistor includes a first sense MOS transistor and a first main MOS transistor,
wherein the second power transistor includes a second sense MOS transistor and a second main MOS transistor,
wherein a source of the first sense MOS transistor is coupled to the sense source terminal of the first power transistor,
wherein a source of the first main MOS transistor is coupled to the Kelvin terminal of the first power transistor,
wherein a source of the second sense MOS transistor is coupled to the sense source terminal of the second power transistor, and
wherein a source of the second main MOS transistor is coupled to the Kelvin terminal of the second power transistor.

15. The semiconductor device according to claim 14,
wherein there is a first parasitic resistor between the source of the first main MOS transistor and the source terminal of the first power transistor, and
wherein there is a second parasitic resistor between the source of the second main MOS transistor and the source terminal of the second power transistor.

16. The semiconductor device according to claim 15,
wherein the arithmetic circuit:
calculates a first current-voltage characteristic of the first sense MOS transistor from the first and second potential differences and the first and second current values,
measures a current flowing through the first main MOS transistor from the first current-voltage characteristic,
calculates a second current-voltage characteristic of the second sense MOS transistor from the third and fourth potential differences and the third and fourth current values, and
measures a current flowing through the second main MOS transistor from the second current-voltage characteristic.

17. The semiconductor device according to claim 16, wherein the second resistor is in a state of being unconnected between the sense source terminal and the Kelvin terminal.

* * * * *